United States Patent [19]

Yasuda et al.

[11] Patent Number: 4,968,893
[45] Date of Patent: Nov. 6, 1990

[54] SCANNING ELECTRON BEAM EXPOSURE SYSTEM

[75] Inventors: Hiroshi Yasuda; Haruo Tsuchikawa; Takayuki Miyazaki, all of Yokohama, Japan

[73] Assignee: Fujitsu Limited, Kawasaki, Japan

[21] Appl. No.: 339,887

[22] Filed: Apr. 18, 1989

Related U.S. Application Data

[63] Continuation of Ser. No. 185,274, Apr. 18, 1988, abandoned, which is a continuation of Ser. No. 9,064, Jan. 27, 1987, abandoned, which is a continuation of Ser. No. 861,652, May 5, 1986, abandoned, which is a continuation of Ser. No. 759,969, Jul. 29, 1985, abandoned, which is a continuation of Ser. No. 454,168, Dec. 28, 1982, abandoned.

[30] Foreign Application Priority Data

Dec. 28, 1981 [JP] Japan ................... 56-211201

[51] Int. Cl.$^5$ ............................................. H01J 37/302
[52] U.S. Cl. ................................. 250/492.2; 250/398
[58] Field of Search ................. 250/492.23, 492.2, 398

[56] References Cited

U.S. PATENT DOCUMENTS 4,145,597  3/1979  Yasuda ................. 250/492.2 X
4,362,942  12/1982  Yasuda ................. 250/492.2 X

FOREIGN PATENT DOCUMENTS 2957  7/1979  European Pat. Off. .

OTHER PUBLICATIONS

Japenese Pat. No. 56-01710 (Abstract); vol. 5, No. 167 (E-79) (839), Oct. 24, 1981.
Patent Abstracts of Japan, vol. 5, No. 167, 10/24/81.
IBM Technical Disclosure Bulletin, vol. 21, No. 8, Jan. 1979, p. 3185, "High Speed E-Beam Focus Correction for Variably Shaped Spot Exposure", Stickel.
IEEE Transactions on Electron Devices, vol. Ed-26, No. 4, Apr. 1979, pp. 668-670, "Recent Advances in Electron-Beam Lithography for the High-Volume Production of VLSI Devices", by H. C. Pfeiffer.

Primary Examiner—Jack I. Berman
Attorney, Agent, or Firm—Staas & Halsey

[57] ABSTRACT

A scanning electron beam exposure system includes two apertures (39a, 48a) for forming a rectangular beam (31). The cross section of the rectangular beam is changed by a deflection unit (47X, 47Y) arranged between the two apertures. The rectangular beam is refocused by a refocusing coil (51) to improve the peripheral sharpness of a projected image of the beam. The refocusing coil is controlled in accordance with the cross section ($X_1$, $Y_1$) of the beam.

5 Claims, 13 Drawing Sheets

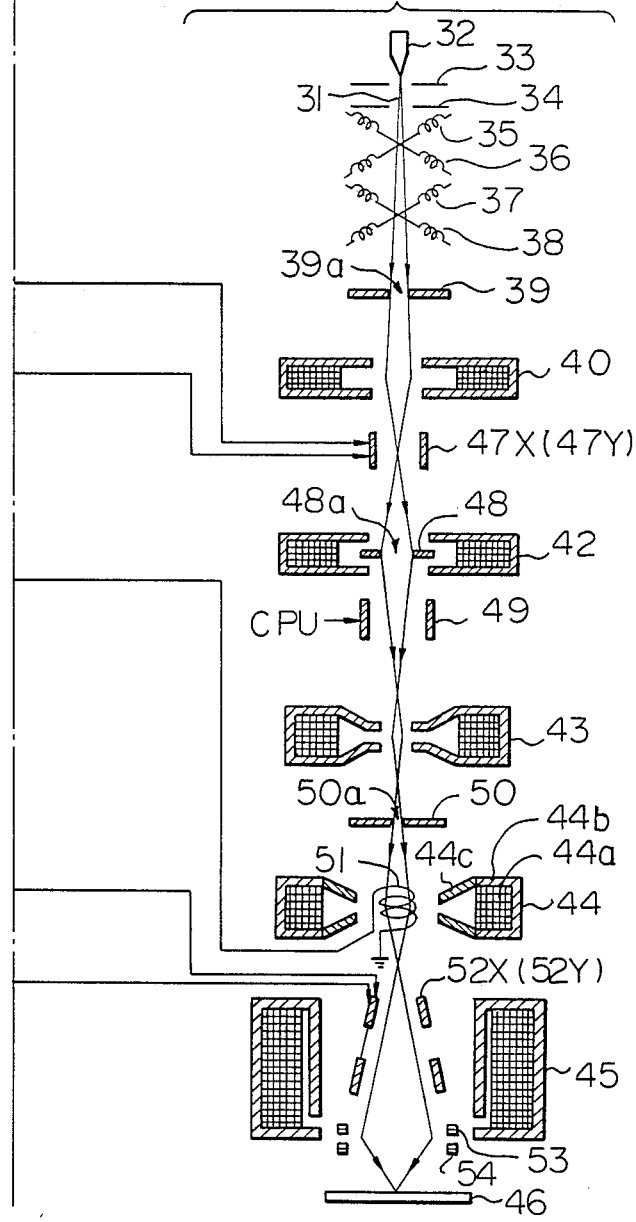
Fig. 4B  BEAM-FORMING AND DEFLECTING PORTION

SCANNING ELECTRON BEAM EXPOSURE SYSTEM

This is a continuation of co-pending application Ser. No. 185,274 filed on Apr. 18, 1988 which is a continuation of Ser. No. 009,064, filed 1/27/87, which is a continuation of Ser. No. 861,652, filed 5/5/86, which is a continuation of Ser. No. 759,969, filed 7/29/85, and which is a continuation of Ser. No. 454,168, filed 12/28/82, all now abandoned.

BACKGROUND OF THE INVENTION

1. Field of the Invention

The present invention relates to an electron beam exposure system. More particularly, it relates to a scanning electron beam exposure system in which the shape of an electron beam is modified.

2. Description of the Prior Art

In recent years, in a scanning electron beam exposure system, a shaped, or rectangular beam has been used to enhance the throughput of the exposure system, as compared with a round beam.

In this system, the total current of the rectangular beam increases as the cross section thereof increases, resulting in the generation of excessive electron-electron interactions or repulsive forces, that is, so-called Coulomb scattering effects. Such electron-electron interactions result not only in increased energy point distribution around the mean beam energy but also result in deterioration of peripheral sharpness due to electron displacement and disorientation.

One approach to weakening the above-mentioned electron-electron interactions is to reduce the current density of an electron beam when the cross section thereof is large. This approach, however, is disadvantageous in regard to the throughput of the exposure system since the beam current itself is also reduced. Another approach is to shorten the length of the electron optical systems, such the magnifying and demagnifying lens systems. This, however, is difficult.

In addition, in the rectangular-beam exposure system, a first rectangular beam-shaping aperture and a second rectangular beam-shaping aperture are provided, and superposition of the two apertures is modified by a deflection unit so as to form an arbitrary rectangular beam. That is, a fluctuation in the cross section of the rectangular beam generates a fluctuation in the mode of electron-electron interactions so that the point of focus of a projected image is shifted. As a result, the sharpness of the projected image is changed in accordance with the fluctuation of the cross section of the rectangular beam.

SUMMARY OF THE INVENTION

It is, therefore, an object of the present invention to provide a scanning electron beam exposure system in which the peripheral sharpness of a projected image is substantially unchanged.

In view of the above-mentioned object, according to the present invention, an auxiliary converging means or a refocusing means is provided to converge or refocus a shaped beam in accordance with the cross section thereof. Compensation for the shifting of the position of the shaped beam due to refocusing also occurs. Further, in order to enhance the throughput of the exposure system, means are provided for dividing a rectangular pattern into a plurality of patterns each having the same size when the rectangular pattern is of a size larger than a predetermined size.

The present invention will be more clearly understood from the description as set forth below with reference to the attached drawings.

DESCRIPTION OF THE PREFERRED EMBODIMENTS

Figure 1:
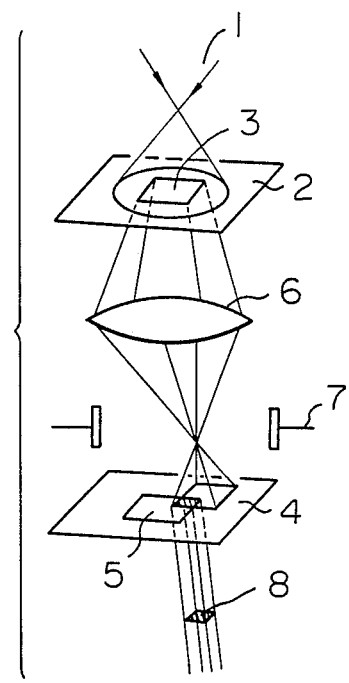
FIG. 1 is a schematic view of a prior art electron beam-forming system utilizing a rectangular beam which can be modified.

In FIG. 1, which is a schematic diagram of a prior art electron beam-forming system, reference numeral 1 designates an electron beam. A first mask 2 having a square or rectangular aperture 3 and a second mask 4 having a square or rectangular aperture 5 are arranged in the path of the electron beam 1. Between the two masks 2 and 4, there is arranged a demagnifying lens 6 and a deflection unit 7 which comprises electrostatic plates.

In FIG. 1, the state of superposition of the two apertures 3 and 5 is modified by the deflection unit 7, which deflects a rectangular electron beam passing through the aperture 3 of the mask 2 so that an arbitrarily rectangular electron beam, indicated by reference numeral 8, is obtained.

Figure 2A:
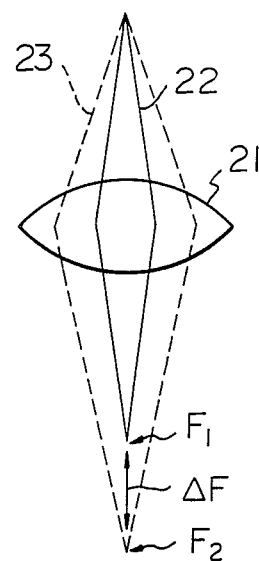
FIGS. 2A and 2B are diagrams of the peripheral sharpness deterioration caused by electron-electron interactions in the system of FIG. 1.
Figure 2B:
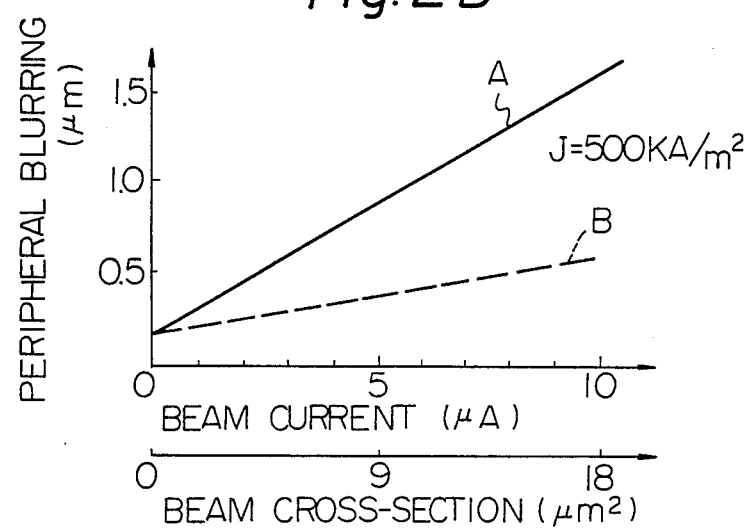

In FIG. 2A, which shows the peripheral sharpness deterioration caused by electron-electron interactions, reference numeral 21 indicates a de-magnifying lens, and reference numerals 22 and 23 indicate electron beams. If the current density is definite, the current of the electron beam 22 is small while the current of the electron beam 23 is large. In such a case, the point of focus $F_2$ of the electron beam 23 is shifted by F from the point of focus $F_1$ of the electron beam 22. This means that the peripheral sharpness of the large-current electron beam 23 is deteriorated as compared with that of the small-current electron beam 22. That is, as the line A in FIG. 2B shows, the periphery of an image is blurred in accordance with the beam cross section or the beam current. In the present invention, a refocusing operation is performed with respect to the deteriorated peripheral sharpness of an electron beam in accordance with the magnitude of the beam cross section. As can be seen from the dashed line B, which shows the peripheral blurring according to the present invention, the peripheral sharpness is improved since the peripheral blurring is small, and the amount of shifting ΔF in FIG. 2A is reduced.

The principle of the present invention will now be explained with reference to FIGS. 3A through 3C.

Figure 3A:
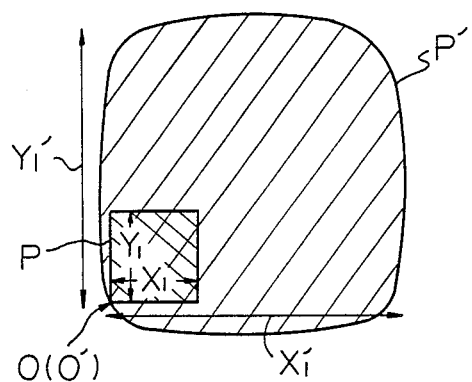
FIGS. 3A, 3B, and 3C are diagrams of how the present invention works.

In FIG. 3A, two rectangular image patterns P and P', which are projected by utilizing the rectangular electron beam 8 of FIG. 1, are illustrated. The pattern P is small in size, as is indicated by size information $X_1$ and $Y_1$, and the pattern P' is large in size, as is indicated by size information $X_1'$ and $Y_1'$. Generally, the peripheral sharpness of the large pattern P' is deteriorated as compared with that of the small pattern P. In this case, however, the origin O of the pattern P is substantially the same as the origin O' of the pattern P'. Note that the origins O and O' are determined by the periphery of the aperture 5 of the second mask 4.

Figure 3B:
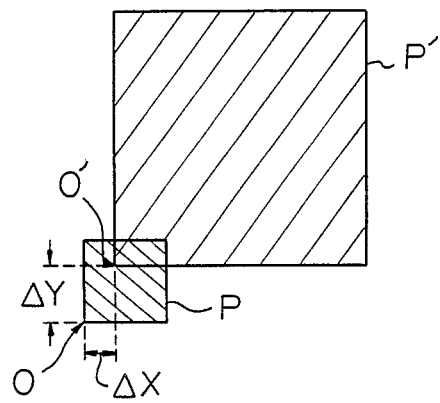

In FIG. 3B, a refocusing operation according to the present invention is performed so as to improve the peripheral sharpness of the image patterns P and P'. In this case, however, the origin O' of the pattern P' is far away from the origin O of the pattern P since the axis of a refocusing coil for performing the above-mentioned refocusing operation does not always coincide with the electron beam axis.

In the present invention, the amount of shifting ΔX and the amount of shifting ΔY of FIG. 3B are detected and, as a result, are proportional to the area of the corresponding image pattern, such as P'.

Figure 3C:
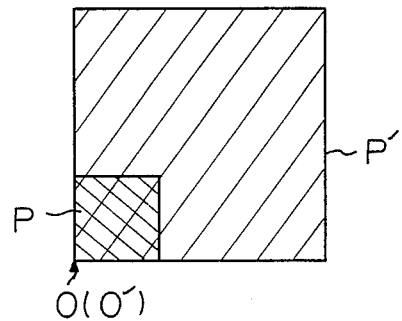

In FIG. 3C, a flyback operation is performed so as to correct the shifting of position indicated by ΔX and ΔY in FIG. 3B. In such a flyback operation, a deflection unit for controlling the position of a projected beam is used.

Figure 4A:
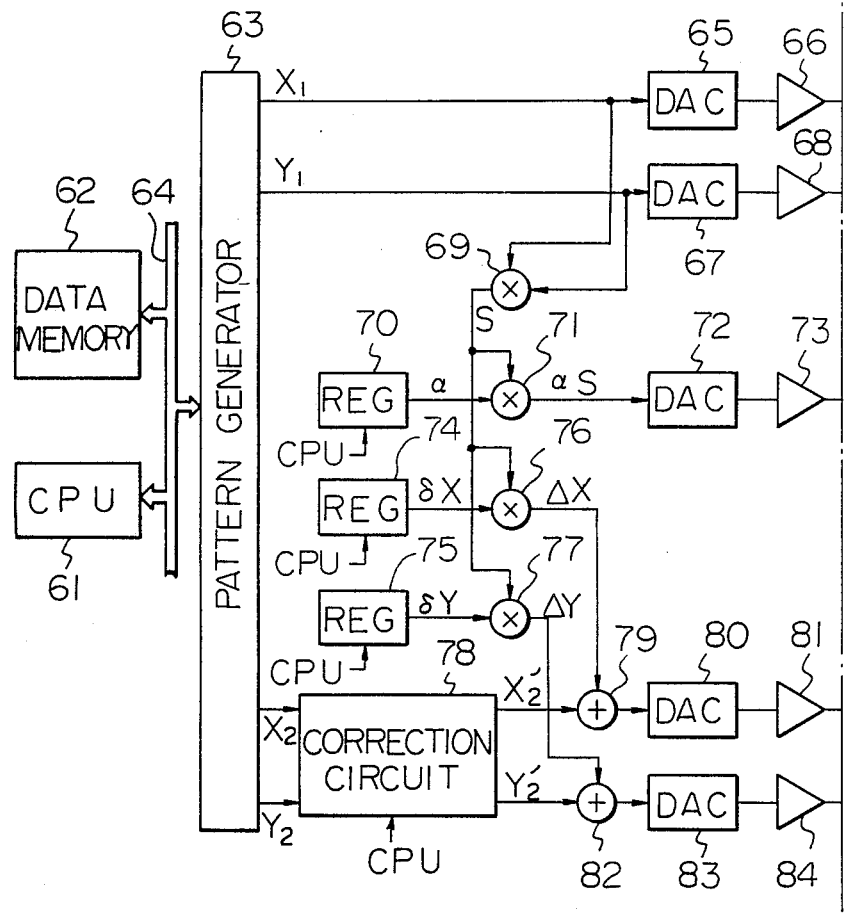
FIG. 4, including 4A and 4B, is a diagram of an embodiment of the scanning electron beam exposure system according to the present invention.

FIG. 4, including 4A and 4B, which is an embodiment of the present invention, is roughly divided into a beam-forming and beam-deflecting portion and a pattern-generating and pattern-control portion.

First, the beam-forming and beam-deflecting portion is explained. Reference numeral 31 indicates an electron beam emitted from an electron gun 32, 33 indicates an anode, 34 indicates a cathode, 35 through 38 indicate aligning coils, 39 indicates a first mask, having a first rectangular aperture 39a, which corresponds to the mask 2 of FIG. 1, and 40 through 45 indicate de-magnifying lenses (coils). The last de-magnifying lens 45 is also called a projecting lens for projecting the electron beam 31 to a target plate 46, such as a wafer or a glass plate.

Reference numerals 47X and 47Y indicate deflection units (plates) for determining the size of the electron beam 31 on the basis of the size information $X_1$ and $Y_1$. The deflection units 47X and 47Y correspond to the deflection unit 7 of FIG. 1. Note that the deflection units 47X and 47Y are, of course, separated from each other; however, only one unit is illustrated so as to simplify the illustration.

A second mask 48, having a second rectangular aperture 48a, which corresponds to the second mask 4 of FIG. 1 is provided within the de-magnifying lens 42.

The beam 31 shaped by the first aperture 39a, the second aperture 48a, and the deflection units 47X and 47Y, passes through a pair of blanking plates 49 which determine whether the beam will be projected onto the plate 46 or will be blanked.

After the beam 31 passes through the demagnifying lens 43 it through round aperture 50a of mask 50. The aperture 50a passes only the electrons passing through the center of the above-mentioned electron optical system, including the de-magnifying lenses.

Figure 5:
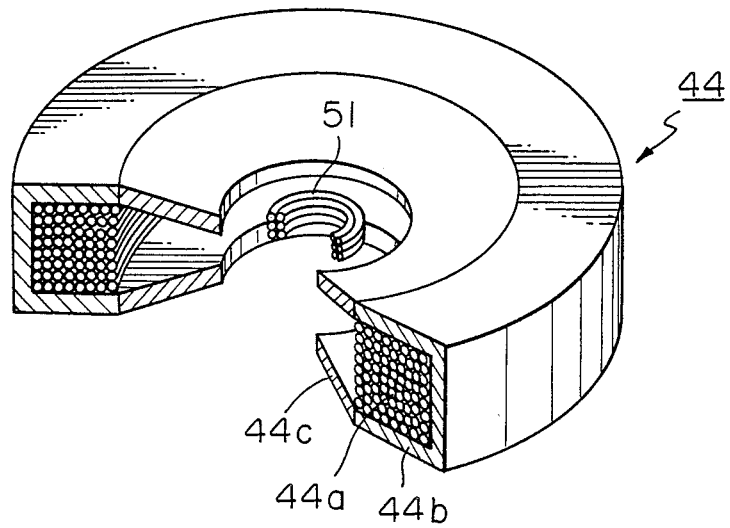
FIG. 5 is a cross-sectional perspective view of the refocusing coil 51 and the de-magnifying lens 44 of FIG. 4.

The de-magnifying lens 44 projects the rectangular beam 31 onto the center of the projecting lens 45. Within the de-magnifying lens 44, an auxiliary converging coil, or a refocusing coil, 51, which is a coreless coil is provided as to improve the peripheral sharpness of the beam 31. As is shown in FIG. 5, the lens 44 comprises coils 44a, an iron frame 44b enclosing the coils 44a, and ferrite pole pieces 44c. The ferrite pole pieces 44c prevent eddy currents and thereby enhance the response speed of the refocusing coil 51.

Within the projecting lens 45, deflection units 52X and 52Y are provided to deflect the beam 31 on the basis of the position information $X_2$ and $Y_2$. The deflection units 52X and 52Y are electrostatic plates. Also, only one of the deflection units 52X and 52Y is illustrated to simplify the illustration.

Reference numerals 53 and 54 indicate a dynamic focusing coil and a stigmatic coil, respectively, for dynamic correction, which is required when deflection of the beam is increased and the beam is far away from the optical axis.

Figure 6:
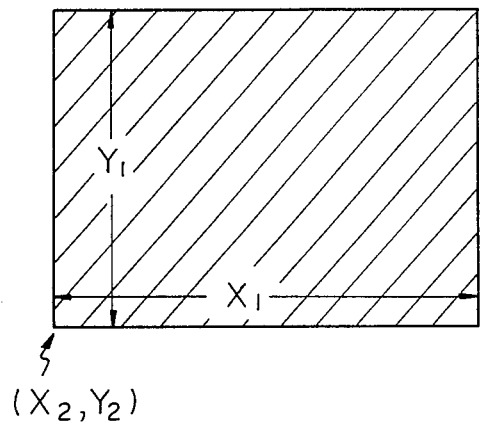
FIG. 6 is a diagram relating size information $X_1$ and $Y_1$ and position information $X_2$ and $Y_2$.

The pattern-generating and pattern-control portion will now be explained. Reference numeral 61 designates a central processing unit (CPU) which controls the entire system, 62 designates a data memory for storing a plurality of rectangular exposure patterns, and 63 designates a pattern generator. The CPU 61, the data memory 62, and the pattern generator 63 are connected to each other by a data bus 64. When a rectangular exposure pattern stored in the data memory is larger than a predetermined size, the rectangular exposure pattern is divided into a plurality of equal patterns by the pattern generator 63, which, in turn, generates equal patterns defined by the size information $X_1$ and $Y_1$ and the position information $X_2$ and $Y_2$, shown in FIG. 6. In this case, $X_1 \leq S_0$ and $Y_1 \leq S_0$, wherein $S_0$ is a predetermined value. The pattern generator 63 will be explained in more detail.

The size information $X_1$ is supplied through a digital-to-analog converter (DAC) 65 and an amplifier 66 to the deflection unit 47X while the size information $Y_1$ is supplied through a DAC 67 and an amplifier 68 to the deflection unit 47Y, with the result that the rectangular beam 31 is shaped or modified in accordance with the size information $X_1$ and $Y_1$. The information $X_1$ and $Y_1$ is supplied to a multiplier 69, which calculates $S = X_1 \cdot Y_1$, S being the beam cross-section.

A register 70 stores a compensation coefficient α, which is periodically renewed by the CPU 61 and which compensates for a focus shift generated due to a change in the cross-section of the electron beam. The coefficient α is determined by $\alpha = I/S$, where I is the current flowing through the refocusing coil 51 and S is the beam cross-section. The values α and S are supplied to a multiplier 71, which calculates a value α·S. The value α·S is supplied through a DAC 72 and an amplifier 73 to the refocusing coil 51, with the result that the refocusing operation is performed in accordance with the magnitude of the cross section of the beam 31. That is, when the size S of the beam 31 is small, the refocusing coil 51 is controlled so as to weaken the converging effect thereof. However, when the size S of the beam 31 is large, the refocusing coil 51 is controlled so as to strengthen the converging effect thereof. As a result, the beam 31 is converged at the same point of focus, regardless of the size S thereof.

Registers 74 and 75 and multipliers 76 and 77 are used for the flyback operation, that is, correction of the axis of the beam 31. Also, the constants γX and γY are stored in the registers 74 and 75, refer to deflection amounts which hold the position of the beam at a definite position when the beam size is changed, and are periodically renewed by the CPU 61. The constant γX is determined by γX=ΔX/S, and the constant γY is determined by γY=ΔY/S. The values γX and S are supplied to the multiplier 76, which calculates ΔX=γX·S, and the values γY and S are supplied to the multiplier 77, which calculates γY=γY·S. Thus, the amount of flyback ΔX and the amount of flyback ΔY are calculated in accordance with the magnitude of the cross section S of the beam 31.

The position information $X_2$ and $Y_2$ is processed by a correction circuit 78, which performs the following well-known correction calculations:

$$X_2' = X_2 + g_x \cdot X_2 + r_x \cdot Y_2 + h_x \cdot X_2 \cdot Y_2 + O_x$$

$$Y_2' = Y_2 + g_y \cdot Y_2 + r_y \cdot X_2 + h_y \cdot X_2 Y_2 + O_x$$

where $g_x$ and $g_y$ are gain coefficients, $r_x$ and $r_y$ are rotational coefficients, $h_x$ and $h_y$ are trapezoidal coefficients, and $O_x$ and $O_y$ are offset coefficients.

The amount of flyback ΔX is added to the corrected position data $X_2'$ by an adder 79. The result, $X_2' + \Delta X$, is supplied through a DAC 80 and an amplifier 81 to the deflection unit 52X. Simultaneously, the amount of flyback ΔY is added to the corrected position data $Y_2'$ by an adder 82. The result, $Y_2' + \Delta Y$, is supplied through a DAC converter 83 and an amplifier 84 to the deflection unit 52Y. Thus, the operation for flying back the shift in position due to the refocusing operation is performed in accordance with the magnitude of the cross-sections of the beam 31.

It should be noted that deflection units exclusively for the flyback operation can also be provided. If such deflection units are provided, the values ΔX and ΔY are supplied thereto.

Figure 7:
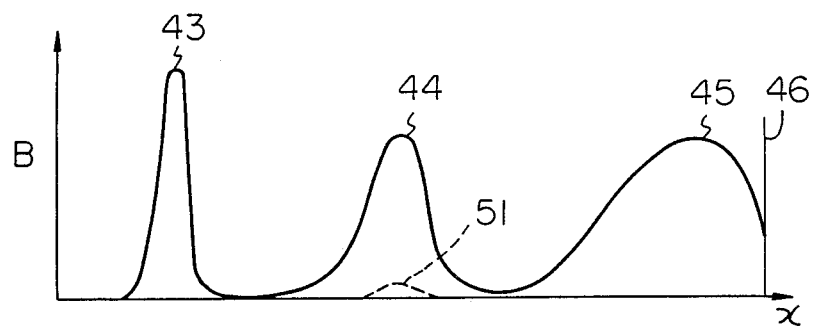
FIG. 7 is a diagram of the arrangement of the refocusing coil 51 in the system of the present invention.

The arrangement of the refocusing coil 51 will now be explained with reference to FIG. 7, which shows the distribution of the magnetic flux density in the path of the beam 31. The efficacy of the refocusing coil 51 is dependent on the magnetic field intensity or the magnetic flux density of the coil 51. That is, the focus distance f is represented by $$\frac{1}{f} \propto \int B^2 dx.$$

Therefore, the amount of shift of the focus $$\Delta\left(\frac{1}{f}\right)$$

due to the refocusing coil 51 is represented by $$\Delta\left(\frac{1}{f}\right) \propto \int B \Delta B \, dx$$

where ΔB is the change of the magnetic flux density due to the refocusing coil 51. As a result, when the magnetic flux density B at the refocusing coil 51 is large, the ability of the refocusing coil 51 to shift the point of focus of the beam 31 is large. Therefore, it is preferable that the refocusing coil 51 be positioned within the lens 43, 44 or 45.

Assume that the refocusing coil 51 is positioned within the de-magnifying lens 43. In this case, the refocusing coil 51 does not have a sufficient effect on the image projected onto the plate 46 since the distance between the refocusing coil 51 and the plate 46 is too great.

Figure 8:
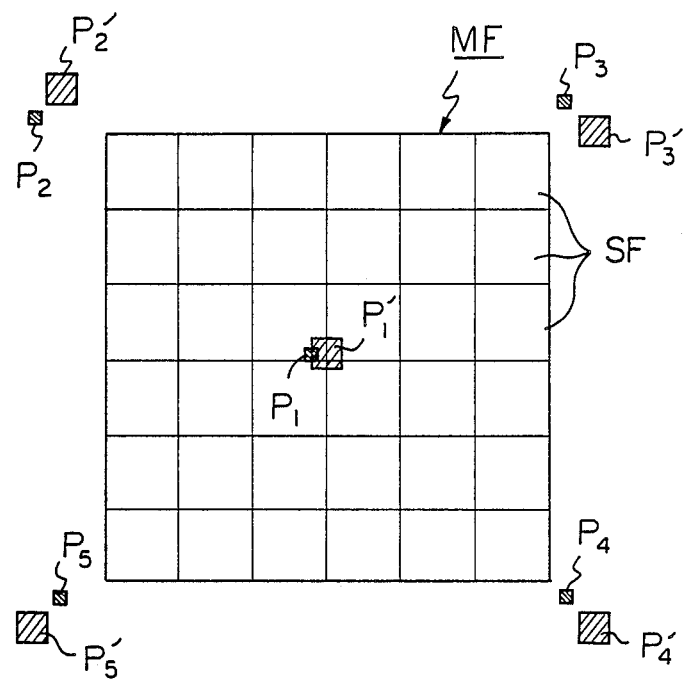
FIGS. 8, 9A, and 9B are diagrams of a flyback operation.

Assume that the refocusing coil 51 is positioned within the last, or projecting, lens 45. In this case, since many other deflection units, such as 53 and 54 are positioned within the projecting lens 45, large magnetic interactions between the refocusing coil 51 and the other deflection units are generated. This is not preferable in regard to the control of the refocusing coil 51. In addition, as illustrated in FIG. 8 which shows projected images at the plate 46 after the refocusing operation, the relative shift in position of a small beam and a large beam in each sub-field SF fluctuates largely due to the large aberration of the projecting lens 45. In FIG. 8, MF indicates a main field determined by, for example, electromagnetic deflection means, SF indicates a sub-field determined by, for example, electrostatic deflection means, $P_1, P_2, \ldots, P_5$ indicate relatively small patterns, and $P_1', P_2', \ldots, P_5'$ indicate relatively large patterns. In this case, the small patterns $P_1, P_2, \ldots, P_5$ superpose the large patterns $P_1', P_2', \ldots, P_5'$, respectively, superpose the large patterns $P_1', P_2', \ldots, P_5'$, respectively, before the refocusing operation. Thus, if the refocusing coil 51 is positioned within the projecting lens 45, it is difficult to perform a flyback operation due to fluctuation of the relative shift in position between a small beam (pattern) and a large beam (pattern).

Figure 9A:
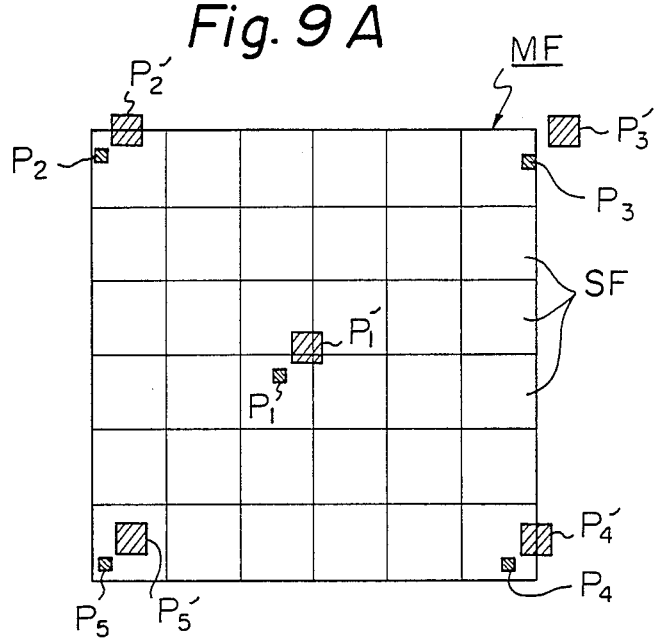
Figure 9B:
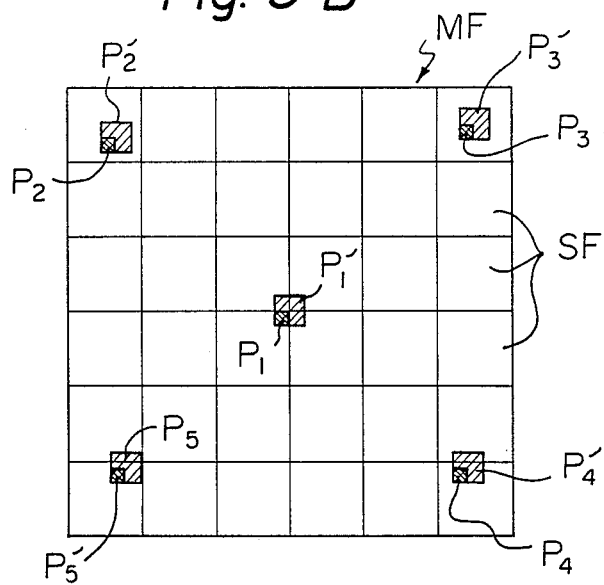

When the refocusing coil 51 is positioned within the lens 44, as is illustrated in FIG. 4, the relative shift in position between a small beam and a large beam after the refocusing operation is uniform in each sub-field, as is illustrated in FIG. 9A, since the aberration of the refocusing lens 51 is, in this case, small. Therefore, after the flyback operation is performed, the small patterns $P_1, P_2, \ldots, P_5$ superpose the large patterns $P_1', P_2', \ldots, P_5'$, respectively, as is illustrated in 9B.

Thus, it is preferable that the refocusing coil 51 be positioned within the lens 44, not within the lens 43 or 45.

Figure 10:
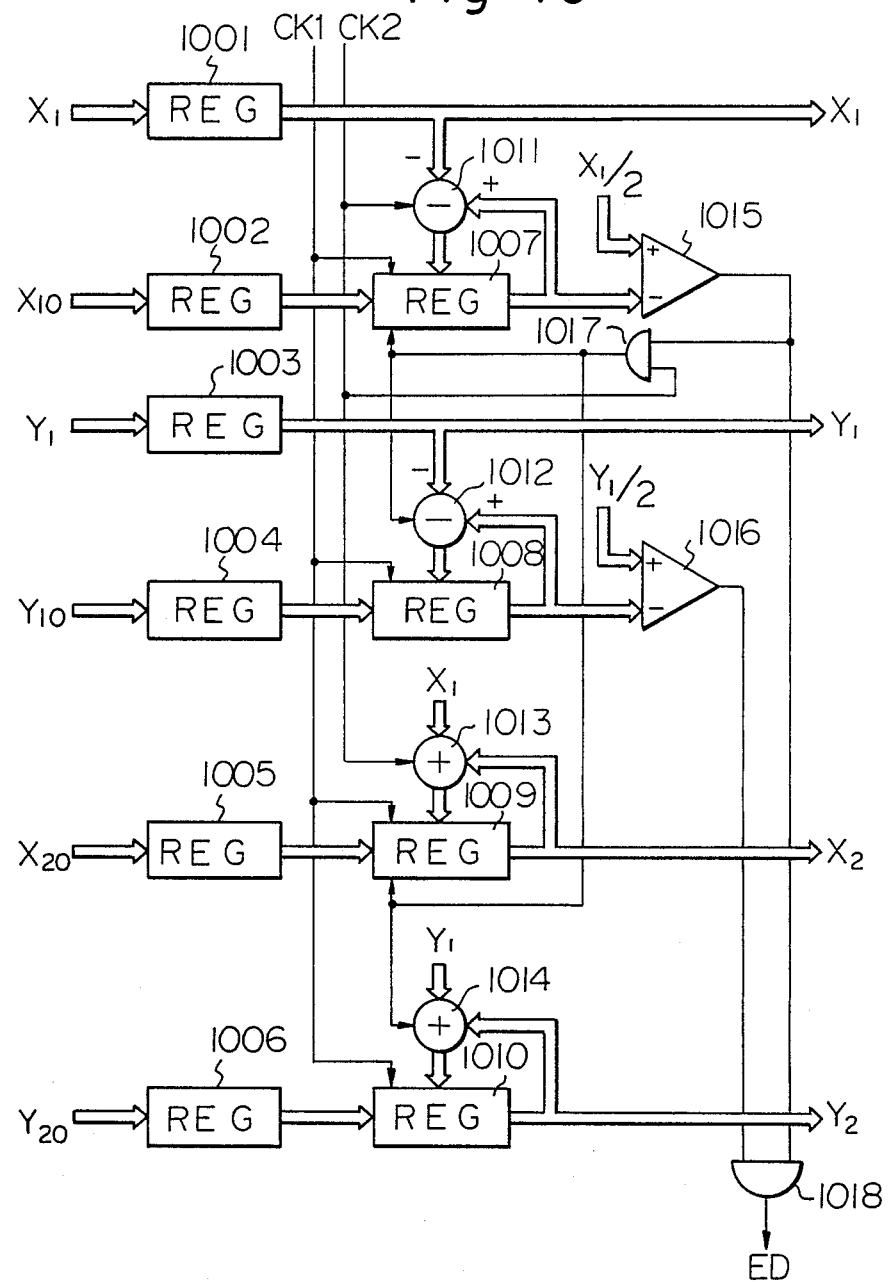
FIG. 10 is a block diagram of the pattern generator of FIG. 4.
Figure 11:
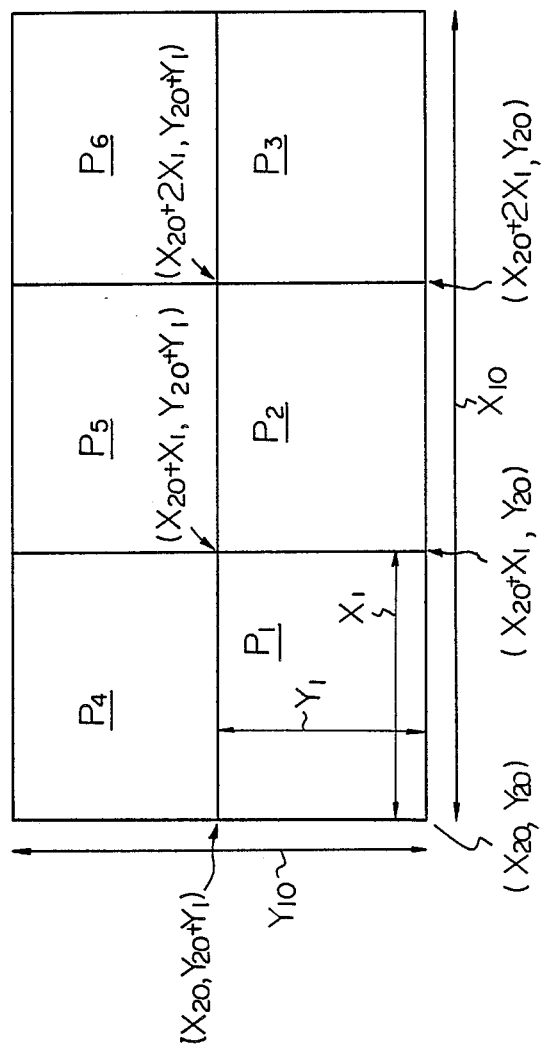
FIG. 11 is a diagram of divided patterns.

The pattern generator 63 of FIG. 4 will now be explained in more detail with reference to FIGS. 10, 11, and 12. If a rectangular exposure pattern stored in the data memory 62 of FIG. 4 is smaller than or equal to a predetermined size, the pattern generator 63 generates the same pattern as that stored in the data memory 62. However, if a rectangular exposure pattern stored in the data memory 62 is larger than the above-mentioned predetermined size, the pattern generator 63 generates a plurality of patterns having the same size. That is, as is shown in FIG. 11, if a large rectangular pattern stored in the data memory is defined by the size information $X_{10}$ and $Y_{10}$ and the position information $X_{20}$ and $Y_{20}$, the pattern generator 63 generates six patterns defined by the size information $X_1$ and $Y_1$. The position information concerning the six patterns is defined by $(X_{20}, Y_{20})$, $(X_{20}+X_1, Y_{20})$, ..., $(X_{20}+2X_1, Y_{20}+Y_1)$, respectively.

Figure 12:
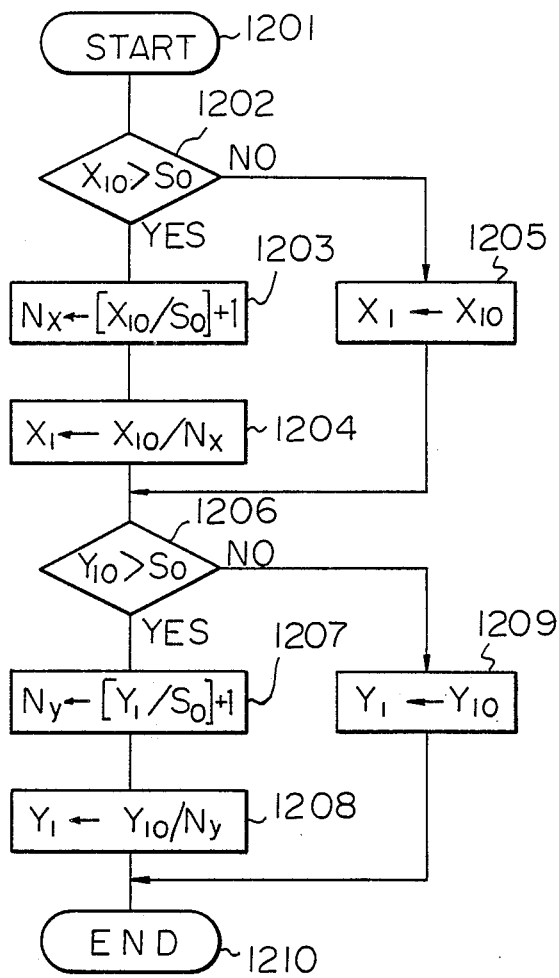
FIG. 12 is a flow chart for the operation of the CPU of FIG. 4.

That is, after the CPU 61 reads the information $X_{10}$, $Y_{10}$, $X_{20}$, and $Y_{20}$ out of the data memory 62, the CPU 61 performs the operation illustrated in FIG. 12. Then the CPU 61 transmits the information $X_1$ and $Y_1$ in addition to the information $X_{10}$, $Y_{10}$, $X_{20}$, and $Y_{20}$.

The operation illustrated in FIG. 12 will now be explained. The operation starts at step 1201. Step 1202 determines whether or not $X_{10}$ is larger than a predetermined value $S_0$. If the answer at step 1202 is affirmative, the control proceeds to step 1203, in which $N_x = ]X_{10}/S_0] + 1$ is calculated. Here, $N_x$ represents the number of divided patterns in the X direction. Next, at step 1204, the CPU 61 calculates $X_1 = [X_{10}/N_x]$, i.e., the size of each divided pattern in the X direction. The control then proceeds to step 1206. However, if the answer at step 1202 is negative, the control proceeds to step 1205, in which $X_1 \leftarrow X_{10}$ is performed. At step 1206, the CPU 61 determines whether or not $Y_{10}$ is larger than the value $S_0$. If the answer at step 1206 is affirmative, the control proceeds to steps 1207 and 1208, in which the number $N_y$ of divided patterns and the size $Y_1$ of each divided pattern in the Y direction are calculated. Then the control proceeds to step 1210. However, if the answer at step 1206 is negative, the control proceeds to step 1209 in which $Y_1 \leftarrow Y_{10}$ is performed. Next, the control proceeds to step 1210, in which the operation of FIG. 12 is completed.

Referring back to FIG. 10, the structure of the pattern generator 63 will now be explained. In FIG. 10, reference numerals 1001 through 1006 designate registers divided into first and second sets for receiving the information $X_1$, $X_{10}$, $Y_1$, $Y_{10}$, $X_{20}$, and $Y_{20}$, respectively, from the CPU 61; 1007 and 1008 designate registers for storing the remainder of divided patterns in the X direction and the Y direction, respectively; 1009 and 1010 designate registers for storing the position information $X_2$ and $Y_2$ of each divided pattern; 1011 and 1012 designate subtracters; 1013 and 1014 designate adders; 1015 and 1016 designate comparators; and 1017 and 1018 designate AND circuits. It is assumed that small values such as $X_1/2$ and $Y_1/2$ are applied by the CPU 61 to the (+) inputs of the comparator 1015 and the comparator 1016, respectively.

The operation of the circuit of FIG. 10 will now be explained with reference to FIG. 11. When the CPU 61 generates a clock signal CK1, the values $X_{10}$, $Y_{10}$, $X_{20}$, and $Y_{20}$ are set in the registers 1007, 1008, 1009, and 1010, respectively. As a result, the position parameters of the first pattern $P_1$ are $$(X_2, Y_2) = (X_{20}, Y_{20}).$$

In this case, the value of the register 1007 is $X_{10}$ ($>X_1/2$), the output of the comparator 1015 remains low, the value of the register 1008 is $Y_{20}$ ($>Y_1/2$), and the output of the comparator 1016 remains low. After exposure of the first pattern $P_1$ is completed, a clock signal CK2 from the CPU 61 is generated to operate the adder 1013. As a result, the value of the register 1019 is changed from $X_{20}$ to $X_{20}+X_1$. Therefore, the position parameters of the second pattern $P_2$ are $$(X_2, Y_2) = (X_{20}+X_1, Y_{20}).$$

Simultaneously, the subtracter 1011 is operated so that the value of the register 1007 is changed from $X_{10}$ to $X_{10}-X_1$ ($\cong 2X_1$). Therefore, the output of the comparator 1015 does not change. Similarly, after exposure of the second pattern $P_2$ is completed, a clock signal CK2 from the CPU 61 is generated to operate the adder 1013. As a result, the value of the register 1009 is changed from $X_{20}+X_1$ to $X_{20}+2X_1$. Therefore, the position parameters of the third pattern $P_3$ are $$(X_2, Y_2) = (X_{20}+2X_1, Y_{20}).$$

Simultaneously, the subtracter 1011 is operated so that the value of the register 1007 is changed from $X_{10}-X_1$ to $X_{10}-2X_1$ ($\cong X_1$). Therefore, the output of the comparator 1015 does not change. Similarly, when exposure of the third pattern $P_3$ is completed, a clock signal CK2 from the CPU 61 is generated to operate the adder 1013. As a result, the value of the register 1009 is changed from $X_{20}+2X_1$ to $X_{20}+3X_1$. However, in this case, the subtracter 1011 is operated so that the value of the register 1007 is changed from $X_{10}-2X_1$ to $X_{10}-3X_1$ ($\cong 0$), and, accordingly, the output of the comparator 1015 is changed from low to high. As a result, the values $X_{10}$ and $X_{20}$ are again set in the registers 1007 and 1009, respectively. Further, the subtracter 1012 is operated so that the value of the register 1008 is changed from $Y_{10}$ to $Y_{10}-Y_1$ ($\cong 1$), and, in addition, the adder 1014 is operated so that the value of the register 1010 is changed from $Y_{20}$ to $Y_{20}+Y_1$. Therefore, the position parameters of the fourth pattern $P_4$ are $$(X_2, Y_2) = (X_{20}, Y_{20}+Y_1).$$

Subsequently, exposure of the patterns $P_4$, $P_5$, and $P_6$ is completed, the output of the comparator 1015 and the output of the comparator 1016 both become high, and, accordingly, the AND circuit 1018 transmits an exposure end signal ED to the CPU 61. Thus, exposure of the pattern defined by the information $X_{10}$, $Y_{10}$, $X_{20}$, and $Y_{20}$ of the data memory 62 is completed.

As was explained above, when a rectangular pattern stored in the data memory 62 is larger than the predetermined size ($S_0 \times S_0$), the pattern is divided into a plurality of patterns having the same size. As a result, the throughput of the electron beam exposure system is improved, which will be explained with reference to FIGS. 13A, 13B, 14A, and 14B.

Figure 13A:
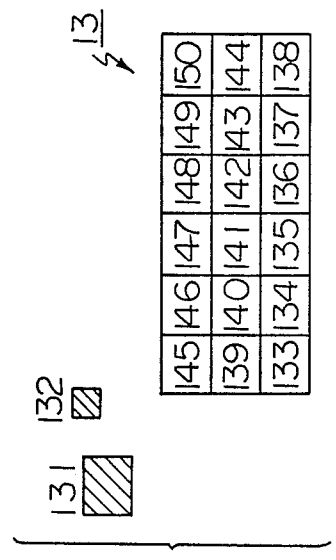
FIGS. 13A, 13B, 14A, and 14B are diagrams of the operating characteristics of the exposure system of the present invention.
Figure 13B:
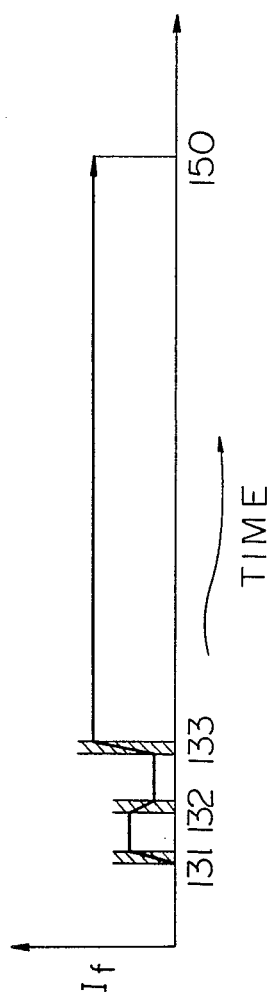

In FIG. 13A, patterns 131 and 132 are smaller than the predetermined size, and a pattern 13 is larger than the predetermined size so that the pattern 13 is divided into a plurality of identical patterns 133 through 150. When the exposure operation is performed on the patterns 131, 132, ..., 150 in that order, the current $I_f$ flowing through the refocusing coil 51 changes, as is shown in FIG. 13B. As a result, the number of current transitions is small, and, accordingly, the entire exposure time is small. The shaded portions indicate transitions of the current $I_f$, in which the beam 31 is blanked to stop the exposure operation.

Figure 14A:
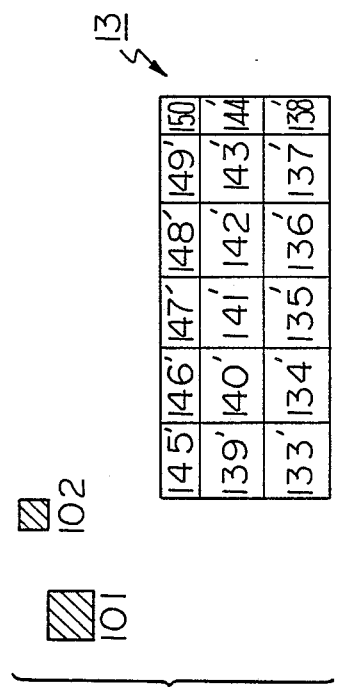
Figure 14B:
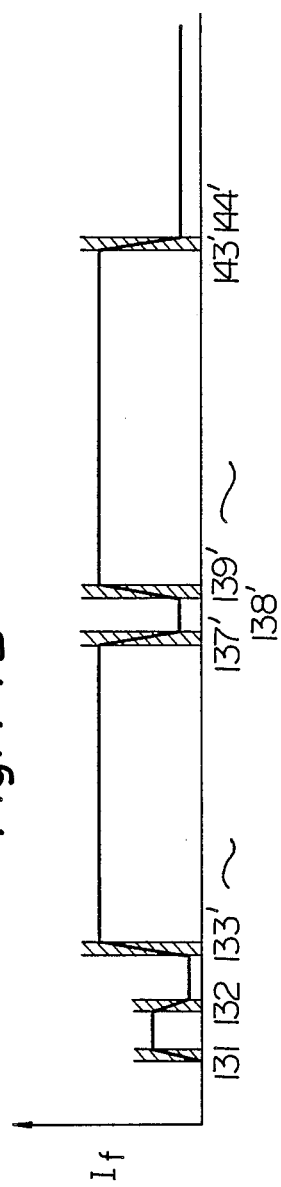

In FIG. 14A, the pattern 13 is divided into a plurality of patterns 133' through 150'. However, in this case, only the patterns 133' through 137' and the patterns 139' through 143' have the same size ($S_0 \times S_0$), the other patterns 138' and 144' through 150' being smaller than the predetermined size. Therefore, when the exposure operation is performed, the patterns 131, 132, and 133' through 150', in that order, the current $I_f$ flowing through the refocusing coil 51 changes, as is shown in FIG. 14B. As a result, the number of current transtions is large, and, accordingly, the entire exposure time is increased as compared with the case illustrated in FIGS. 13A and 13B.

Thus, in respect to the throughput of the exposure system, it is necessary that a large pattern be divided into a plurality of patterns each having the same size.

As was explained hereinbefore, according to the present invention, the peripheral sharpness of a projected image is improved by a refocusing operation in accordance with the magnitude of the cross-section of a beam.

We claim:

1. A scanning electron beam exposure system providing an electron beam, comprising:
   means for emitting the electron beam;
   first aperture means for passing the electron beam therethrough;
   second aperture means for passing therethrough the electron beam passed through said first aperture means to shape the cross section of the electron beam into a rectangular form;
   means for storing and transmitting information on a plurality of rectangular patterns defined by first size information and first position information;
   pattern-generating means, operatively connected to said storing means, for generating information on an exposure pattern defined by second size information and second position information;
   first deflecting means, operatively connected to said pattern-generating means and positioned beween said first and second aperture means, for deflecting the electron beam to change the shape of the cross section of the electron beam passed through said second aperture means in accordance with the second size information;
   at least two converging means, located at different positions in he electron beam exposure system, for converging the electron beam;
   means for refocusing the electron beam passed through said second aperture means in accordance with the second size information, said refocusing means comprising:
   a coreless coil provided within a first one of said at least two converging means and adjacent to a second one of said at least two converging means;
   first multiplying means, operatively connected to said pattern-generating means, for multiplying said second size information and outputting a first multiplied signal;
   first register means for storing a first coefficient;
   second multiplying means, operatively connected to said first register means and said first multiplying means, for multiplying the first multiplied signal by said first coefficient and outputting a second multiplied signal; and
   driving means, operatively connected to said second multiplying means and said coreless coil, for driving said coreless coil in accordance with the second multiplied signal; and
   second deflecting means, operatively connected to said pattern-generating means, for deflecting the electron beam passed through said refocusing means in accordance with said second position information.

2. A system as set forth in claim 1, further comprising flyback means, operatively connected to said refocusing means, for flying back the electron beam passed through said refocusing means and correcting the shift in the position of the electron beam in accordance with the second size information.

3. A system as set forth in claim 2, wherein said flyback means comprises:
   second register means, operatively connected to said first multiplying means, for storing a second coefficient;
   third register means, operatively connected to said first multiplying means, for storing a third coefficient;
   third multiplying means, operatively connected to said second register means and said first multiplying means, for multiplying the first multiplied signal by said second coefficient and outputting a first signal; and
   fourth multiplying means, operatively connected to said third register means and said first multiplying means, for multiplying said first multiplied signal by said third coefficient and outputting a second signal, and wherein said flyback means controls said second deflecting means in accordance with the first and second signals of said third and fourth multiplying means.

4. A system as set forth in claim 1, wherein said pattern-generating means generates a plurality of divided exposure patterns each having the same size when said storing means transmits a rectangular pattern which is larger than a predetermined size.

5. A system as set forth in claim 4, wherein said pattern-generating means comprises:
   first registers divided into first, second and third sets, operatively connected to said means for storing and transmitting information, for receiving the information;
   second registers, operatively connected to the first set of said first registers, for storing the divided exposure patterns;
   third registers, operatively connected to the second set of said first registers, for storing the position information;
   subtracters operatively connected to the third set of said first registers and said second registers;
   adders operatively connected to the third set of said first registers and said third registers;
   comparators operatively connected to said second registers; and
   first and second AND circuits, said first AND circuit operatively connected to said comparators and said second AND circuit operatively connected to one of said comparators, one of said adders, one of said subtracters, one of said second registers and one of said third registers.

* * * * *

UNITED STATES PATENT AND TRADEMARK OFFICE
CERTIFICATE OF CORRECTION

PATENT NO.  : 4,968,893

DATED       : NOVEMBER 6, 1990

INVENTOR(S) : HIROSHI YASUDA ET AL.

It is certified that error appears in the above-identified patent and that said Letters Patent is hereby corrected as shown below:

Col. 4, line 4, "lens 43 it through round aperture 50a of mask 50. The" should be --lens 43, it passes through a round aperture 50a of a mask 50. The--.

Col. 5, line 9, "$\gamma X$ and $\gamma Y$" should be --$\delta X$ and $\delta Y$--;

line 13, "$\gamma X$" should be --$\delta X$--;

line 14, "$\gamma X = \Delta X/S$," should be --$\delta X = \Delta X/S$,--; and "$\gamma Y$" should be --$\delta Y$--;

line 15, "$\gamma Y = \Delta Y/S$," should be --$\delta Y = \Delta Y/S$,--; and "$\gamma X$" should be --$\delta X$--;

line 17, "$\Delta X = \gamma X \cdot S$," should be --$\Delta X = \delta X \cdot S$,--; and "$\gamma Y$" should be --$\delta Y$--;

line 18, "$\gamma Y = \gamma Y \cdot S$." should be --$\Delta Y = \delta Y \cdot S$.--;

line 31, "gX and gY" should be --$g_x$ and $g_y$--.

Col. 6, line 38, "super-" should be deleted;

line 39, "pose the large patterns $P_1$, $P_2$, ..., $P_5$, respectively," should be deleted.

Col. 7, line 17, "$N_x =$]" should be --$N_x = [$--.

UNITED STATES PATENT AND TRADEMARK OFFICE
CERTIFICATE OF CORRECTION

PATENT NO. : 4,968,893

DATED : NOVEMBER 6, 1990

INVENTOR(S) : HIROSHI YASUDA ET AL.

It is certified that error appears in the above-identified patent and that said Letters Patent is hereby corrected as shown below:

Col. 9, line 42, "he" should be --the--.

Signed and Sealed this

Eleventh Day of August, 1992

Attest:

DOUGLAS B. COMER

Attesting Officer

Acting Commissioner of Patents and Trademarks